United States Patent [19]
Saveker

[11] 3,939,358
[45] Feb. 17, 1976

[54] PLURAL LOAD LIGHTING ASSEMBLY ENERGIZABLE THROUGH TWO INPUT TERMINALS

[76] Inventor: James A. Saveker, 1801 W. 40th St., Lorain, Ohio 44053

[22] Filed: Nov. 7, 1974

[21] Appl. No.: 521,797

[52] U.S. Cl. ............................................... 307/22
[51] Int. Cl.² .......................................... H02J 3/02
[58] Field of Search ............. 307/22, 72, 73, 74, 75; 315/161, 164, 210, 219, 312, 315, 324

[56] References Cited
UNITED STATES PATENTS

| | | | |
|---|---|---|---|
| 2,681,429 | 6/1954 | Long | 315/283 |
| 3,180,999 | 4/1965 | Kuykendall | 315/320 X |
| 3,433,971 | 3/1969 | Hufford | 307/22 X |
| 3,525,876 | 8/1970 | Breslin | 307/22 |

*Primary Examiner*—Herman J. Hohauser

[57] ABSTRACT

Two individual lamp loads are mounted on, are support by, and are electrically terminated within one plural lamp load housing assembly which has a single pair of electrical input terminals. An apparatus within said housing, which senses applied A-C electrical energy characteristic and applied D-C electrical energy characteristic, is electrically terminated between said two lamp loads and said single pair of input terminals providing means for individual and selective energization of said two lamp loads, with either applied D-C electrical energy being further supplied to first lamp load only of said two lamp loads or applied A-C electrical energy being further supplied to second lamp load only of said two lamp loads, said selection being a function of applied electrical energy characteristic. A power source means, which can be actuated to selectively supply either D-C electrical energy of said required polarity characteristic or A-C electrical energy to said two input terminals, controls and supplies said electrical energy to said sensing apparatus and further to said two lamp loads.

7 Claims, 4 Drawing Figures

PLURAL LOAD LIGHTING ASSEMBLY ENERGIZABLE THROUGH TWO INPUT TERMINALS

This invention relates to a circuit and assembly for energizing a plurality of loads, and more specifically to an efficient circuit and assembly for individually and selectively energizing either one of two loads and/or a combination of loads through a single pair of input terminals. Lamp loads will be considered throughout this specification as an ideal application for this invention, however it is understood that this invention is not limited in application for use with loads of lamp types only.

Typically, when it is desirable to remotely control and energize two lamp loads individually and selectively at one physical plural lamp fixture location, a minimum of three input terminals are supplied to said plural lamp fixture location, with one of the said three input terminals being common to said two lamp loads. By connecting an electrical power source across one of the not common said input terminals and the said common input terminal, the respective one lamp load of the said two lamp loads can be energized selectively and individually. While such a three input system is satisfactory in many applications, it is oftentimes desirable to have the capability of selectively and individually energizing two loads remotely through a single pair of input terminals. Such is the case, as an example, when it is desirable to selectively and individually energize two lamp loads, one being a low intensity decorative type and one being a high intensity type, utilizing an existing two input terminal wiring system and lamp female receptacle such as are commonly found in most concealed in the wall building lighting circuits and associated lighting fixtures. Alteration of such an existing concealed two input terminal system, to add the ordinarily needed said third input terminal for said two lamp load selective and individual energization, is generally very expensive and/or inconvenient to the extent of being prohibitive.

The present invention provides means for two lamp loads, incorporated within one plural lamp load assembly, to be selectively and individually energized through one two input terminal electrical supply system and one two input terminal lamp load female receptacle such as are commonly found in standard building lighting circuits. The extent to which this invention controls said two lamp loads, utilizing a two input terminal system, is described in detail within the circuit description to follow.

It is one object of this invention to provide a means for selectively and individually energizing a pair of loads to the extent of supplying D-C electrical energy to a first load only of said pair of loads or A-C electrical energy to a second load only of said pair of loads, and to provide such control and said energization through a single pair of input terminals.

It is a second object of this invention to provide a means for selectively and individually energizing one load only of a plurality of loads with D-C electrical energy or the energization of the said plurality of loads with A-C electrical energy, and to provide such control and said energization through a single pair of input terminals.

It is a third object of this invention to provide a means for supplying pulsating D-C electrical energy to one load only of a plurality of loads continuously, independently, and uninterrupted, while maintaining total A-C electrical energy control to a second load of said plurality of loads, and to provide such control and said energization of said plurality of loads through a single pair of input terminals.

One feature of this invention is a single plural lamp load housing assembly, having a single pair of input terminals, in which either of two individual lamp loads, integral to said housing assembly, can be remotely energized selectively and individually, to the extent herein specified, through said single pair of input terminals.

Another feature of this invention is the provision of a two load energization control circuit comprising an electrically controllable unidirectional conduction switching means such as a silicon controlled rectifier with associated controlling means, and further comprising an electrically controllable bidirectional conduction switching means such as a triac with associated controlling means. Said two load energization control circuit provides means for sensing applied input electrical energy characteristics and, dependent on said input electrical energy characteristics, further selects and energizes individually the said pair of loads. The said two load energization control circuit senses and selectively passes applied D-C electrical energy of a required polarity characteristic to a first load only of said pair of loads. Said two load energization control circuit also senses and selectively passes A-C electrical energy only to a second load only of said pair of loads. Said A-C electrical energy and said D-C electrical energy is supplied to said two load energization control circuit from an actuable source means through a two input terminal system.

Further objects, features, and advantages of this invention will be apparent to those skilled in the art from the following description and drawings.

DETAILED DESCRIPTION OF THE INVENTION DISCLOSED

Figure 1:
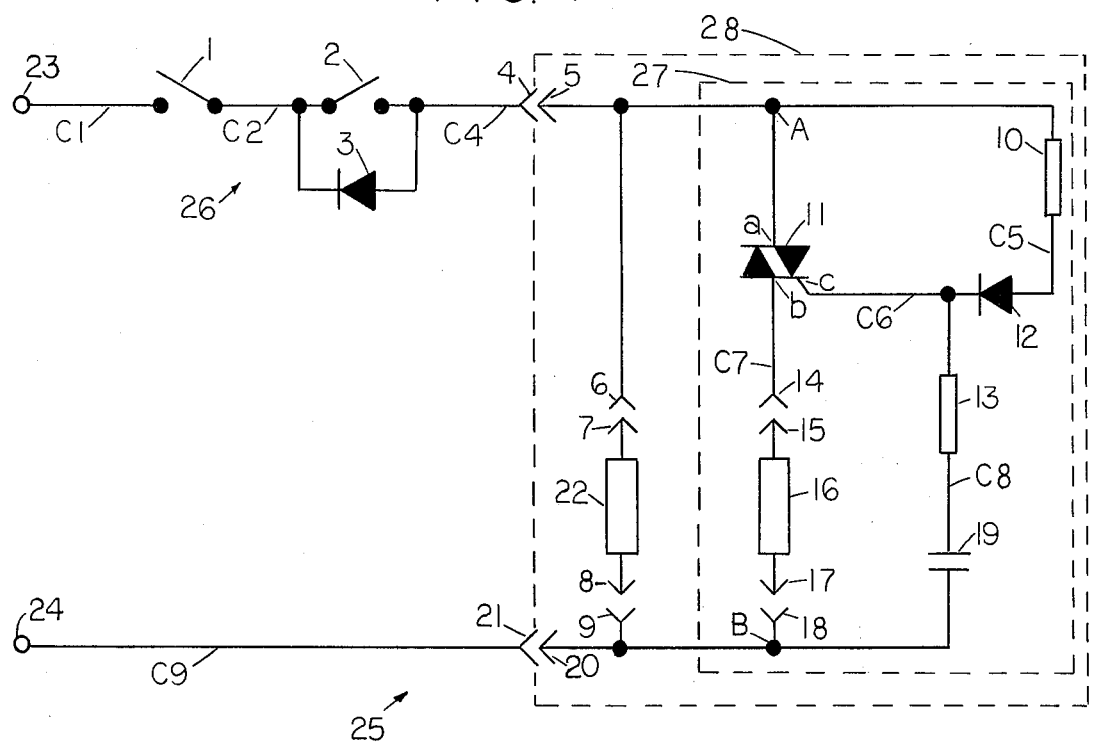
FIG. 1 is a schematic drawing of the general plural load circuit for the present invention.

Referring to FIG. 1, the drawing schematically illustrates the general circuit 25 for the present invention. Single phase A-C electrical energy is applied across terminals 23 and 24 from a suitable A-C power source serving as the circuit's 25 power supply. An actuable assembly 26, comprising SPST switch 1, SPST switch 2, and diode 3, forms the actuable controlling means within and for general circuit 25. conductors C1, C2, C4, and C9 form means for transmitting electrical energy from said actuable assembly 26 to female terminals 4 and 21, male terminals 5 and 20 respectively, and to the two load energization control circuit 28. Terminals 4, 5, 20, and 21 provide means for electrical extention of conductors C4 and C9. Male terminals 5 and 20 mate and contact with female terminals 4 and 21 respectively and thus provide means for electrical energy application through terminals 6, 7, 8, and 9 to a first load 22, located electrically within the two load energization control circuit 28. Conductors C4 and C9 are further terminated within the said two load energization control circuit 28 at a second load controlling assembly 27, comprising an electrically controllable bidirectional conduction switching means further comprising triac 11, and further comprising resistor 10, capacitor 19, resistor 13, diode 12, load 16, male and female terminals 14, 15, 17, 18, and conductors C5, C6, C7, and C8.

The operation of the circuit 25 of FIG. 1 is as follows:

Single phase A-C electrical energy is applied to terminals 23 and 24 from a suitable source. When switch 1 is in the open position and switch 2 is in the open position, the circuit 25 is totally de-energized.

Now, closing switch 1 only permits pulsating D-C current to flow through, and as a result of, diode 3 and thus energizes first load 22 while said pulsating D-C potential is also applied across the second load controlling assembly 27 at points A and B. Diode 12 is connected in the triac 11 gate terminal 11c conduction path in a direction such that said diode 12 is reverse biased, as a function of diode 3, and is thus non-conducting. The said applied pulsating D-C potential across triac main terminals 11a and 11b, via said points A, b, and load 16, does not cause a resulting current flow through triac 11 and load 16, since traic gate terminal 11c current is not permitted to flow as a result of reverse biased diode 12. With switch 1 only closed, triac 11 remains in an 'off' state, thus said load 16 remains deenergized while load 22 is energized by said diode 3 caused pulsating D-C applied across said load 22.

Further, when both switch 1 and switch 2 of FIG. 1 are closed, single phase source A-C electrical energy is applied to both first load 22 and second load controlling assembly 27 at points A and B. A-C electrical energy is present at points A and B and load 22 due to switch 2 shunting diode 3. Load 22 receives and is energized by the applied A-C electrical energy directly vai conductors C4 and C9. Having said A-C electrical energy applied to the second load controlling circuit 27, pulsating D-C current flows through resistor 10, diode 12, triac gate terminal 11c, and triac 11 to triac main terminal 11b, as a rectifying function of diode 12, during A-C electrical energy alternations when conductos C4 and C5 are of a positive polarity relative to conductors C9 and C7. The said pulsating D-C current flow through, and as a result of, diode 12 further charges capacitor 19 via resistor 13, during the first applied positive polarity A-C electrical energy source alternation, making conductor C8 positive relative to conductor C9. Triac 11 is of a type in which its inherent electrical characteristics permit gate trigger firing by either positive or negative polarity gate terminal electrical energy characteristics applications. At the very beginning of said first applied positive polarity A-C electrical energy supply alternation, at which time diode 12 is forward biased and is conducting, triac 11 is turned 'on' by said diode 12 current flowing through triac gate terminal 11c to triac main terminal 11b. with triac 11 turned 'on', current flows through triac 11 from main terminal 11a to main terminal 11b. The said current flow through triac 11 must also flow through load 16, thus energizing load 16 during the time triac 11 is in the positive polarity said 'on' state. Due to triac 11 electrical characteristics, resistor 13 and capacitor 19 series combination receives the same positive and negative electrical energy application characteristics as appears across load 16, being fed back via gate terminal 11c, after triac 11 is initially turned 'on' by the said positive polarity diode 12 current. During A-C electrical energy supply alternations of opposite polarity to that just described, or negative polarity, diode 12 is reverse biased and is thus in a non-conductive state, further cutting off diode 12 supplied triac gate terminal 11c source current. However, due to capacitor phase shifting qualities, capacitor 19 remains charged from the previous said positive polarity A-C supply alternation at the time the A-C supply electrical energy passes through the zero point of the waveshape, and thus discharges through resistor 13, triac gate terminal 11c, and triac 11. The capacitors's 19 said discharge current through triac terminal 11c again turns triac 11 'on', thus again energizing load 16 with A-C electrical supply energy, and further charges capacitor 19 negatively during this said negative polarity A-C electrical energy supply alternation. During subsequent positive polarity A-C electrical energy supply alternations, following the said first applied complete A-C electrical energy supply cycle, triac 11 is turned 'on' by the phase shifted current through triac gate terminal 11c as a result of capacitor 19. Also, during subsequent negatively polarized A-C electrical energy supply alternations, triac 11 is turned 'on' by the phase shifted current through triac gate terminal 11c as a result of capacitor 19. Resistor 10 and diode 12 are only used to initially turn triac 11 'on' when the very first positive polarity A-C electrical energy alternation is supplied when switch 2 is first closed. Resistors 10 and 13, within the second load controlling assembly 27, act as current limiters. The above described sequence, involving the operation of the second load controlling assembly 27, is repeated each A-C cycle of applied A-C electrical energy thus energizing load 16 with full wave A-C electrical energy whenever switches 1 and 2 are closed in the circuit of FIG. 1.

Summarizing the action of the circuit shown in FIG. 1, load 22 only is energized with pulsating D-C electrical energy when switch 1 only is closed; and loads 22 and 16 are energized simultaneously with A-C electrical energy when switches 1 and 2 are closed. Thus the second object of this invention has been fulfilled within the circuit of FIG. 1.

Figure 2:
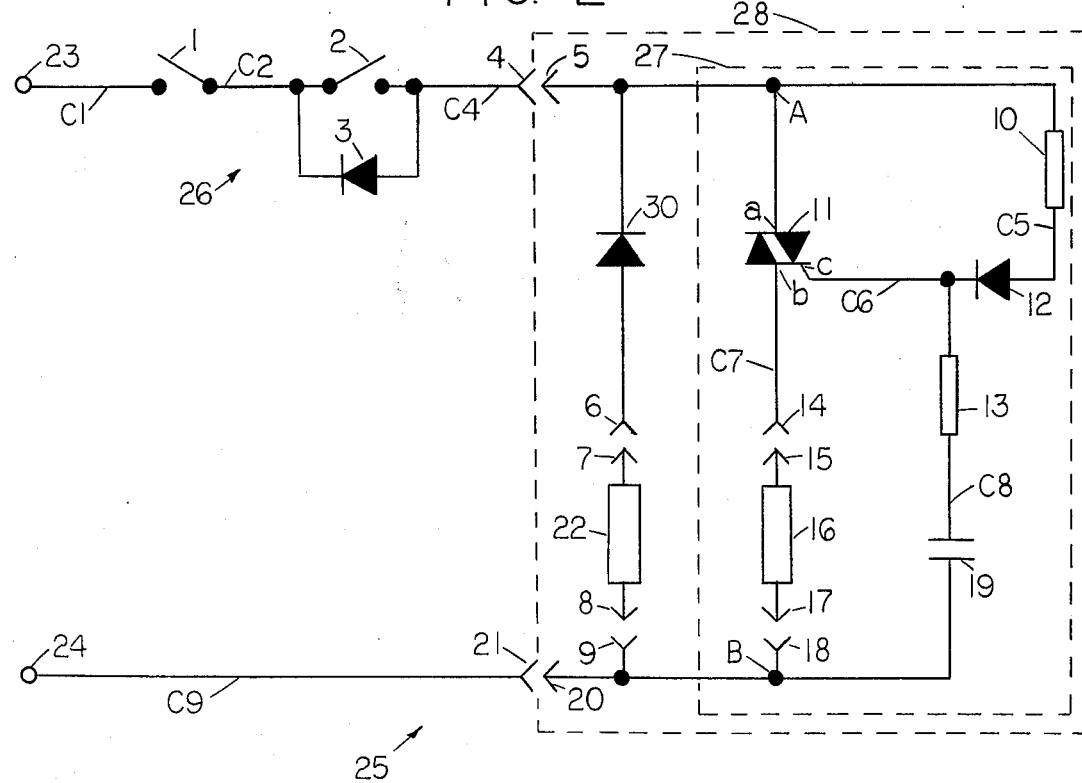
FIG. 2 schematically illustrates a circuit similar to that shown in FIG. 1, but which is slightly changed to allow one load only of a pair of loads to be energized by D-C only, regardless of the application of A-C or D-C electrical energy characteristic.

With reference now to FIG. 2, through the addition of one diode 30, the first load 22 of FIG. 1 is energized with D-C electrical energy regardless of the A-C or D-C electrical energy application characteristic. Due to the similarities between the circuits of FIG. 1 and FIG. 2, only the differences therebetween are herein discussed. In FIG. 2 the basic circuit is identical to that shown in FIG. 1, but for the addition of diode 30 in series with load 22. Diode 30 does not in any way change the described function of the second load controlling assembly 27. The addition of diode 30 does permit load 22 to be energized continuously with D-C electrical energy, switch 1 being closed, while full A-C electrical energization control is maintained over load 16. Load 22 sees only pulsating D-C since diode 30 simply passes diode 3 rectified pulsating D-C electrical energy when switch 1 only is closed, and since diode 30 rectifies the applied A-C to pass pulsating D-C electrical energy when switch 1 and switch 2 are closed.

The circuit of FIG. 2 fulfills the third object of this invention.

Figure 3:
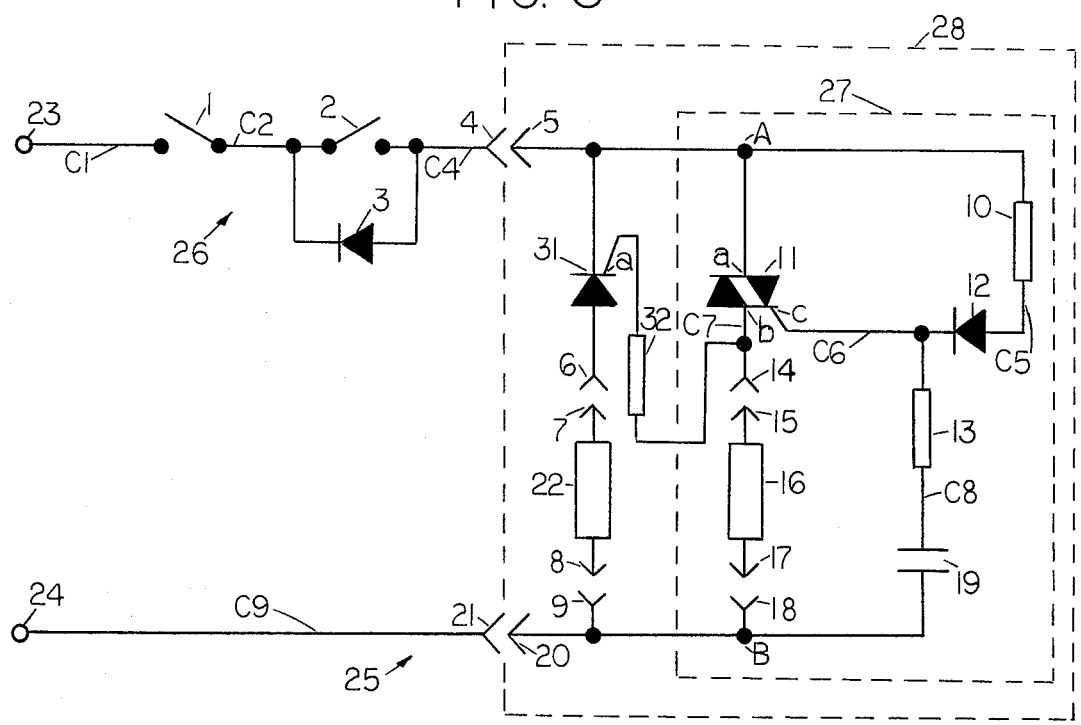
FIG. 3 illustrates a circuit similar to that shown in FIG. 1, but which is slightly changed to provide means for further energization control over one load only of a pair of loads by an electrically controllable unidirectional conduction switching means comprising a silicon controlled rectifier and associated control means.

With reference now to FIG. 3, an electrically controllable unidirectional conduction switching means further comprising a silicon controlled rectifier 31 and further comprising resistor 32 have been added to the circuit of FIG. 1. Due to the similarities of the circuit of FIG. 1 and the circuit of FIG. 3, only the differences therebetween are hereindiscussed. In FIG. 3, the basic circuit is identical to that shown in FIG. 1, but for the additions of SCR 31 and resistor 32. With reference to the previously described second load controlling assembly's 27 action, when switch 1 is closed and switch 2 is open, triac 11 is 'off' and conductor C7 is positively polarized relative to conductor C4. This positive polarity permits SCR 31 gate terminal 31a current to flow through SCR 31, resistor 32, and load 16, thus turning SCR 31 'on'. When SCR 31 is 'on', load 22 is energized by the source pulsating D-C electrical energy, being A-C electrical energy supply rectified by diode 3. Load 22 is energized by the same current that flows through SCR 31 since load 22 is in series with SCR 31.

When switch 1 and switch 2 are closed in the circuit of FIG. 3, triac 11 turns 'on' by means as was previously described for the circuit of FIG. 1. When triac 11 is 'on,' triac 11 shunts SCR 31 gate terminal 31a current. With SCR 31 gate terminal 31a current shunted, said gate terminal 31a current drops to near zero and thus SCR 31 does not turn 'on,' further removing source energy from load 22. Now, it can be generally stated that the circuit of FIG. 3 offers characteristics that de-energize load 22 whenever A-C electrical energy is supplied by the energy source and the actuable assembly 26 means and whenever load 16 is energized through triac 11; and load 22 is energized only when said required polarized electrical energy is applied and whenever load 16 is de-energized.

The said first object of this invention has been fulfilled by the circuit of FIG. 3.

Figure 4:
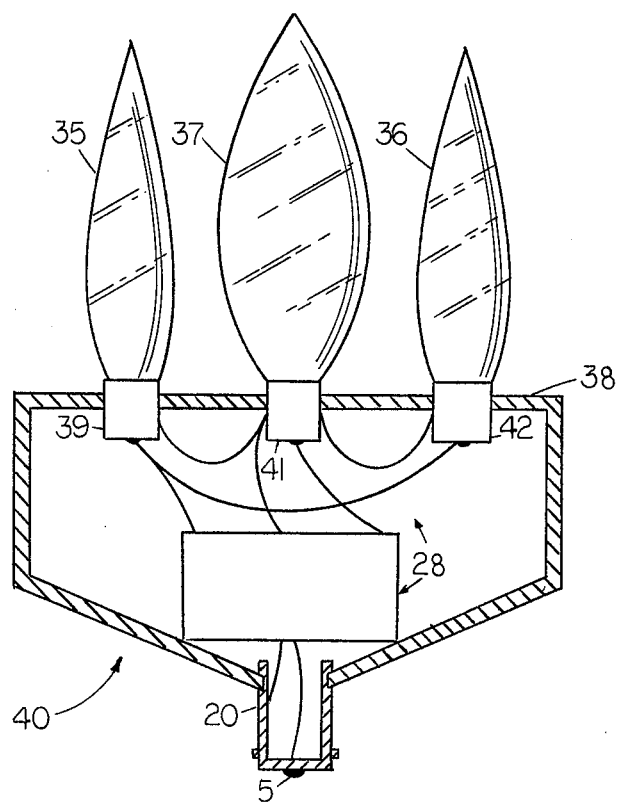
FIG. 4 is an illustration of the housing assembly for this invention showing a plural lamp load arrangement and the physical enclosure of the two load energization control circuit within said housing.

Referring now to FIG. 4, the housing assembly 40 for this invention is illustrated. The housing assembly 40 physically supports a plural lamp load arrangement and further encloses the two load energization control circuit 28. The plural lamp loads are here illustrated as three light producing incandescent male based lamps 35, 36, and 37. Lamps 35 and 36 are connected in parallel further forming load 22 in the circuits of FIGS. 1, 2, and 3; and lamp 37 singularly forms load 16 in the circuits of FIGS. 1, 2, and 3. The housing assembly 40 case 38 is formed in a suitable shape and is of a structure suitable in order to physically support lamp sockets 39, 41, and 42, lamps 35, 36, and 37, and to enclose the two load energization control circuit 28. Said housing assembly 40 is attached to and is physically supported by male base terminals 5 and 20 means. Base terminals 5 and 20 also form the two input terminal means for the two load energization control circuit 28. Circuit operation within housing assembly 40 is identical to the circuits operations of the circuits described in FIGS. 1, 2, and 3, therefore explanation of said circuits operations will not be duplicated herein.

While certain preferred embodiments of the invention have been specifically disclosed, it is understood that the invention is not limited thereto, as many variations will be readily apparent to those skilled in the art and the invention is to be given its broadest interpretation within the terms of the following claims.

I claim:
1. A plural load control system comprising:
   first circuit means further connecting two input terminals to a pair of loads and further having internal means for selectively energizing first load only of said pair of loads with D-C electrical energy when D-C electrical energy of a required polarity characteristic is present across said two input terminals and for energizing said pair of loads with A-C electrical energy when A-C electrical energy is present across said two input terminals; and
   source means for connecting electrical energy through said two input terminals, including second circuit means actuable to supply D-C electrical energy of said required polarity characteristic and actuable to supply A-C electrical energy.

2. The plural load control system as recited in claim 1 wherein said first circuit means includes:
   one electrically controllable bidirectional conduction switching means connected to first input terminal of said pair of input terminals and in series with a second load only of said pair of loads, means for rendering said electrically controllable bidirectional conduction switching means fully conductive whenever A-C electrical energy is applied across said two input terminals further supplying said A-C electrical energy to said second load, means for rendering said electrically controllable bidirectional conduction switching means fully non-conductive whenever D-C electrical energy of said required polarity characteristic is applied across said two input terminals from said source means, and means for connecting said first load only of said pair of loads across said two input terminals for electrical energization of said first load with electrical energy of a characteristic corresponding to said second circuit means supply characteristic, and means for connecting said second load terminals to said electrically controllable bidirectional conduction switching means and further to second input terminal of said pair of input terminals.

3. The plural load control system as recited in claim 2 wherein said second circuit means includes means actuable in order to supply D-C electrical energy of said required polarity characteristic across said two input terminals of said first circuit means, and means actuable in order to supply A-C electrical energy across said two input terminals of said first circuit means.

4. The invention as recited in claim 3 and further comprising within said first circuit means a poled diode connected between and in series with said first load and said first input terminal for providing pulsating D-C electrical energy only to said first load, independent of A-C electrical energy application or D-C electrical energy of said required polarity characteristic application to said two input terminals.

5. The plural load control system as recited in claim 3 and further comprising within said first circuit means an electrically controllable unidirectional conduction switching means connected between and in series with said first input terminal and said first load, control means for rendering said electrically controllable unidirectional conduction switching means fully conductive whenever D-C electrical energy of said required polarity characteristic is applied across said two input terminals and further energizing first load, and said control means for rendering said electrically controllable unidirectional conduction switching means fully non-conductive whenever A-C electrical energy is applied across said two input terminals and further de-energizing said first load.

6. The plural load control system as recited in claim 3 and further having said electrically controllable bidirectional conduction switching means comprising a three electrode solid state electronic triac.

7. The plural load control system as recited in claim 5 and further having said electrically controllable unidirectional conduction switching means comprising a three electrode solid state electronic silicon controlled rectifier.

* * * * *